United States Patent [19]

Sevenhans et al.

[11] Patent Number: 5,422,889
[45] Date of Patent: Jun. 6, 1995

[54] OFFSET CORRECTION CIRCUIT

[75] Inventors: Joannes M. J. Sevenhans, Brasschaat; Daniel Sallaerts, Aarschot; Arnoul O. G. Vanwelsenaers, Schilde; Jacques Wenin, Louvain-la-Neuve, all of Belgium

[73] Assignee: Alcatel N.V., Amsterdam, Netherlands

[21] Appl. No.: 144,276

[22] Filed: Oct. 28, 1993

[30] Foreign Application Priority Data

Oct. 28, 1992 [EP] European Pat. Off. ............ 92203303

[51] Int. Cl.$^6$ ...................... H04B 1/30; H04B 7/212
[52] U.S. Cl. ..................... 370/95.3; 455/324
[58] Field of Search ............... 328/146, 149; 307/358, 307/359; 455/235.1, 246.1, 324; 370/95.3; 375/76

[56] References Cited

U.S. PATENT DOCUMENTS

| | | | |
|---|---|---|---|
| 4,852,126 | 7/1989 | Tanaka et al. | 375/76 |
| 4,878,029 | 10/1989 | Saulnier et al. | 329/341 |
| 5,144,256 | 9/1992 | Lim | 329/302 |
| 5,263,196 | 11/1993 | Jasper | 455/324 |
| 5,307,379 | 4/1994 | Bergstrom et al. | 375/76 |

FOREIGN PATENT DOCUMENTS

| | | |
|---|---|---|
| 0474615 | 3/1992 | European Pat. Off. |
| 9105247 | 1/1991 | WIPO |
| 9114311 | 9/1991 | WIPO |

OTHER PUBLICATIONS

"Some Experiments on Direct-Conversion Receivers", U. Bolliger et al, *Fifth International Conference on Radio Receivers and Associated Systems*, Cambridge, GB, Jul. 23–27, 1990; IEEE Lindon, 1990, pp. 40–44.

*Mobile Cellular Telecommunications Systems*, W. Lee, McGraw-Hill Book Company, 1989, pp. 411–416.

*Digital Communications—Fundamentals and Applications*, B. Sklar, Prentice Hall International Editions, 1988, pp. 90–91.

*Digital Communications—Fundamentals and Applications*, B. Sklar, Prentice-Hall International Editions, 1988, pp. 142–144.

*Digital Communications—Fundamentals and Applications*, B. Sklar, Prentice-Hall International Editions, 1988, pp. 555–562.

Primary Examiner—Benedict V. Safourek
Attorney, Agent, or Firm—Ware, Fressola, Van Der Sluys & Adolphson

[57] ABSTRACT

The direct conversion receiver DCR receives analog modulating signals with a reference average value and modulated within assigned time slots of a TDMA-structure on a carrier with a carrier frequency FC which changes from time slot to time slot. DCR includes a demodulator circuit DC-coupled to a baseband circuit, the demodulator circuit including a local oscillator LO and a mixer MIX and the baseband circuit including an offset correction circuit OCC/OCC' for updating different variable parameter offset correction values for different FC stored in a memory MEM and compensating offset introduced in DCR. OCC/OCC' determines, upon occurrence of an assigned time slot, an updated offset correction value as a function of an old offset correction value in a corresponding storage location of MEM and the difference between an average value of the analog signal and the reference average value, and thereupon stores the result in the corresponding storage place.

11 Claims, 1 Drawing Sheet

1

OFFSET CORRECTION CIRCUIT

TECHNICAL FIELD

The present invention relates to an offset correction circuit for removing offset from an input signal being input thereto in assigned time slots.

BACKGROUND OF THE INVENTION

Such an offset correction circuit is e.g. described in the published PCT patent application PCT/US90/05358. The offset correction circuit described herein forms part of a receiver receiving an input signal which is modulated on a carrier and which includes an offset correction part with a known average value. Upon reception of this offset correction part its average value is measured and subtracted from the known average value in a digital signal processor (DSP), the result of which gives an offset correction value for "subsequently received data information" of the input signal. It is however clear that such an offset correction circuit can only be implemented when the input signal includes such an offset correction part, and that this has a negative impact on the throughput capacity of a communication system which includes a receiver with such an offset correction circuit. This is all the more valid as the offset correction value is only updated upon receipt of a new offset correction part and thus a sufficient number of offset correction parts is to be transmitted per unit of time in order to accurately keep track of offset changing in time. Furthermore, if the offset depends upon a variable parameter this parameter dependency is not considered.

DISCLOSURE OF INVENTION

An object of the present invention is therefore to provide an offset correction circuit of the above known type but wherein no offset correction part negatively influencing the throughput capacity of the input signal is needed, and wherein offset is more accurately compensated for.

According to the invention, this object is achieved due to the fact that said offset depends upon a variable parameter whose value is characterized by one of a plurality of possible variable parameter values, one of which is valid in each of said assigned time slots, and that said offset correction circuit includes a servo control loop which includes:
- storage means storing a variable parameter offset correction value for each of said plurality of possible variable parameter values;
- a comparator circuit to inputs of which said input signal and one of said variable parameter offset correction values are applied and which provides a difference signal at its output;
- a signal averaging circuit wherein said difference signal is averaged over each of said time slots, thereby providing an instant average value;
- a subtracter circuit wherein said instant average value is subtracted from a reference average value of said input signal, thereby providing a resulting control value; and
- a calculating means which regularly combines said resulting control value with said one variable parameter offset correction value, and stores the result in said storage means.

Thus, by considering the reference average value of the input signal no use needs to be made of an offset correction part such as in the above mentioned PCT patent application, which, hence, no longer negatively influences the throughput capacity of the input signal.

Furthermore, since an offset correction value as calculated e.g. according to the above mentioned PCT patent application does not take the value of the variable parameter into account, it does not represent an accurate offset correction value, since different variable parameter values give rise to different offsets.

By providing a storage means storing a variable parameter offset correction value for each of the possible variable parameter values, the input signal is during a time slot compared and corrected in the comparator circuit with the variable parameter offset correction value stored for the possible variable parameter value valid in that time slot. Thereby, a distinction is made between offset values which are different as they are typified by different possible variable parameter values. To be noted that the variable parameter being typified by one of a plurality of possible variable parameter values means that one and the same variable parameter offset correction value may be stored for different values of the variable parameter characterized by a same possible variable parameter value. If the value of the variable parameter is one of a number of discrete values this could mean e.g. that only one variable parameter offset correction value is stored per n discrete values, n being an integer, which may be justified when the offset only changes slightly in function of the variable parameter.

By regularly updating the variable parameter offset correction values stored in the storage means, variations of the offset are accurately followed. This updating can be done at each of the assigned time slots or, e.g. when the offset appears to be only slowly varying in function of time, once every n assigned time slots in which a signal with offset typified by one and the same possible variable parameter value is processed. Hence, the offset is more accurately compensated for than in the prior art.

To be noted that a variable parameter offset correction value corresponding to a possible variable parameter value is to be updated with use of a resulting control value obtained for a time slot in which the same possible variable parameter value is valid.

A further characteristic feature of the present offset correction circuit is that it is applied in a direct conversion receiver including a demodulator circuit to an input of which a carrier modulated by an analog modulating signal in said assigned time slots is applied and which provides at its output a demodulated analog signal constituting said input signal, that said offset correction circuit is included in a baseband circuit which is DC coupled to said demodulator circuit.

Thus, the demodulator circuit being DC coupled to the baseband circuit, the input signal contains offset introduced thereto both before reception of the analog modulating signal modulated carrier and in the demodulator circuit. The offset correction circuit removes this offset from the demodulated analog signal.

It is to be noted that the problem of offset introduced in a receiver could also be solved by AC-coupling the demodulator circuit and the baseband circuit since this would block off the offset previously introduced. However, if the spectrum of the demodulated analog signal presented at an output of the mixer extends downwards to e.g. approximately 100 Hz, which is a common figure for such a demodulated analog signal in a direct conversion receiver, a capacitor providing the AC-coupling would need to have a large value in order for such low frequency parts of the demodulated analog signal not to be reduced too much by an RC low-pass filter constituted by this capacitor and an input impedance of the baseband circuit. This is disadvantageous in that such capacitors are voluminous and usually have a large leaking resistance. Furthermore when the receiver is powered up or when within a time slot a signal is received with a higher or lower power level than in the previous time slot, the RC filter needs some time to settle, i.e. some time for transient regimes to fade out, this time being of the order of the low-pass time constant of the RC filter, i.e. e.g. approximately 10 msec for a 100 Hz low-pass filter. However, this time interval is normally not provided as settling is required within a time interval of typically maximum a few tenths of msec. It should be noted that one could solve this problem by providing a switched capacitor circuit for the AC-coupling as described e.g. in the article "Some experiments on direct conversion receivers" by U. Bolliger and W. Vollenweider, published for IEE Conference at Cambridge, July 1990, pp. 40-44. This however constitutes a circuit which is large and difficult to design. Furthermore, one should note that if the analog signal has an average value different from zero, this value has to be reconstructed afterwards in case of AC-coupling. To be noted that even if an analog signal with a zero average value is provided, its average value over a time slot may still be different from zero. These AC-coupling problems may be avoided in case of DC-coupling.

Yet a further characteristic of the present offset correction circuit is that said carrier has a carrier frequency constituting said variable parameter.

In view of the fact that offset is partly caused by leakage due to capacitive or inductive coupling in the direct conversion receiver, the carrier frequency is an important parameter to describe the offset. It should be noted that a technique known in the art as frequency-hopping thus gives rise to offsets which are different from time slot to time slot as they depend upon a carrier frequency which changes from time slot to time slot.

Still a further characteristic of the present offset correction circuit is that said direct conversion receiver includes at least one amplifier stage having a gain mode constituting said variable parameter.

Since, as mentioned above, part of the offset is due to leakage because of capacitive or inductive coupling in the direct conversion receiver, this offset part is composed by a portion due to leakage to an input of the amplifier and a portion due to leakage to an output of the amplifier. Hence, the first portion being influenced by the amplifier gain mode unlike the second portion, the offset provided at different values of the gain mode is different and dependent upon the ratio of the first portion to the second portion. Therefore, the gain mode is an important parameter in describing the offset. In general, a distinction between variable parameter offset correction values for different gain modes can be made for each amplifier of the direct conversion receiver having a gain mode with different possible values.

Still a further characteristic feature of the present offset correction circuit is that said demodulator circuit includes a local oscillator and a mixer.

Thereby, offset is generated in the direct conversion receiver as described hereinafter.

A first source of offset is constituted by so-called local oscillator leakage, i.e. a signal provided by the local oscillator at a local oscillator input of the mixer which partly leaks to a received signal input of the mixer due to capacitive or inductive crosstalk between the latter two inputs, and which is, at the received signal input of the mixer, added to the received signal. The mixer then multiplies the received signal with the local oscillator signal the result of which includes the square of the local oscillator signal, ergo a DC part, so that an offset is generated which depends on the level of the local oscillator signal, and which due to the crosstalk being frequency dependent, varies with the frequency of the local oscillator signal.

A second source of offset is due to so-called self-mixing which means that the received signal partly leaks to the local oscillator input of the mixer. Thereby, the result of the multiplication operation performed by the mixer including a DC part resulting from the square of the received signal, an offset is generated which also depends on the frequency of the received signal as well as on its power level. As for the local oscillator leakage mentioned above, the frequency dependency is due to the crosstalk between the local oscillator input and the received signal input of the mixer. A third offset source is caused by so-called front-end pick-up, which is constituted by the local oscillator signal partly leaking via the environment of the receiver, e.g. a housing surrounding it, to an input of the mixer, e.g. via a high frequency part included in the receiver or even via an antenna coupled to such an input. Like the first offset source this causes part of the local oscillator signal to be added to the received signal thereby introducing an offset in the mixer which is also dependent upon the frequency of the local oscillator signal. Moreover, since this offset is due to leakage via the environment it is also influenced by the position of the receiver and thus e.g. by a person holding the receiver or a handset thereof and by the position of this handset.

To be noted that the second and the third mentioned offset source provide unpredictable offset parts, the second due to its dependency upon the power level and the frequency of the received signals and the third due to its position dependency, whereas the offset introduced by the first mentioned offset source could theoretically be measured and compensated for at fabrication since it only depends on the frequency and the power level of the local oscillator signal, which are known. However, due to alteration of component characteristics with time such compensation does not remain accurate, which moreover, also applies to offset introduced due to component mismatches.

Thus the combination of the offset sources mentioned above provides an offset which depends upon the power level as well as the frequency of both the local oscillator signal and the received signals, and the position of the receiver.

A further characteristic feature of the present direct conversion receiver is that it includes an additional correction circuit for determining within each of said time slots a single offset correction value which is independent from said variable parameter, and which is applied to a second input of said comparator circuit so that said difference signal is proportional to the difference between said input signal and both said variable parameter offset correction value and said single offset correction value.

If the number of bits received per time slot, these bits constituting the digital signal, is small, then the instant average value, which is calculated over one time slot, has a Gaussian probability distribution whose mean is the average of the input signal including offset, i.e. whose mean is equal to the sum of the reference average value and the offset, and which has a large standard deviation since this standard deviation is inversely proportional to the square root of the number of bits. Hence an accurate estimate of the average value of the difference signal can only be made when calculating it over a large number of time slots thus decreasing the standard deviation by a factor equal to the square root of this number of time slots. When the average is to be calculated only over time slots with the same value of the variable parameter, i.e. carrier frequency—and/or gain mode if a distinction due to an amplifier with different gain modes is made—the latter number is to be especially large when use is made of a large number of different possible variable parameter values, i.e. values of the carrier frequency—and/or gain mode.

In this case it takes some time for an accurate estimate of the offset correction value to be made, so that the difference signal which is further processed to provide an output signal for the baseband circuit, may temporarily after starting up the direct conversion receiver or after a new analog signal is received by it, still include too large an offset thereby possibly saturating portions of the baseband circuit. The single offset correction value might then, to avoid this saturation, be calculated and applied to correct the input signal.

Yet a further characteristic feature of the present direct conversion receiver is that said assigned time slots each include a leading part within which said input signal contains no information to be detected, that said demodulator circuit is preceded by a switching means for disconnecting said analog modulated signal carrier from said demodulator circuit during said leading part, and that within said leading part said single offset correction value is determined in said additional correction circuit so that the value of said difference signal is substantially zero.

Although in this way the single offset correction value does not account for offset introduced due to received signals or due to receiver parts preceding the demodulator circuit, the single offset correction value determined at each time slot provides a substantially exact compensation of the offset present during a leading part. It should be noted that this offset compensation is only necessary temporarily after start-up or after reception of a new analog signal modulated carrier, as mentioned above, and that it is less accurate than the offset compensation provided by the variable parameter offset correction value after this transition period.

Still another characteristic feature of the present direct conversion receiver is that said additional correction circuit includes a comparator comparing said difference signal with zero and thereby acting as a one-bit analog-to-digital convertor, cascaded with a successive approximative digital to analog convertor determining in successive steps said single offset correction value so that the value of said difference signal is substantially zero.

The comparator only detects the sign of the output value, hence no absolute measurement is done and the difference signal may even saturate the comparator.

Furthermore, the successive approximative digital to analog convertor not having to be linear since the value of the difference signal is successively adapted within one and the same leading part until it is substantially zero, a highly accurate convertor, i.e. with a low LSB-error, can be used.

Still a further feature of the present offset correction circuit is that it includes a forward correction circuit in which offset remaining on said difference signal is removed by correcting it with a forward offset correction value.

If offset still remains on the difference signal, e.g. because the difference signal of which the instant average value is calculated, is obtained after amplification of the difference between the input signal and the variable parameter offset correction value and hence, the offset on the latter difference occurs amplified in the difference signal, it can easily be removed from the difference signal since it is reduced by the amplification factor as compared to a situation without the servo control loop.

Yet a further characteristic of the present offset correction circuit is that said forward offset correction value is constituted by said variable parameter offset correction value, and that said forward correction circuit includes a digital filter to inputs of which said difference signal and said resulting control value are applied and an output of which provides an offset corrected version of said input signal.

Thus, the already available resulting control value is applied to further correct the difference signal. To be noted that the difference signal is to be converted to a digital signal before being applied to the digital filter.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
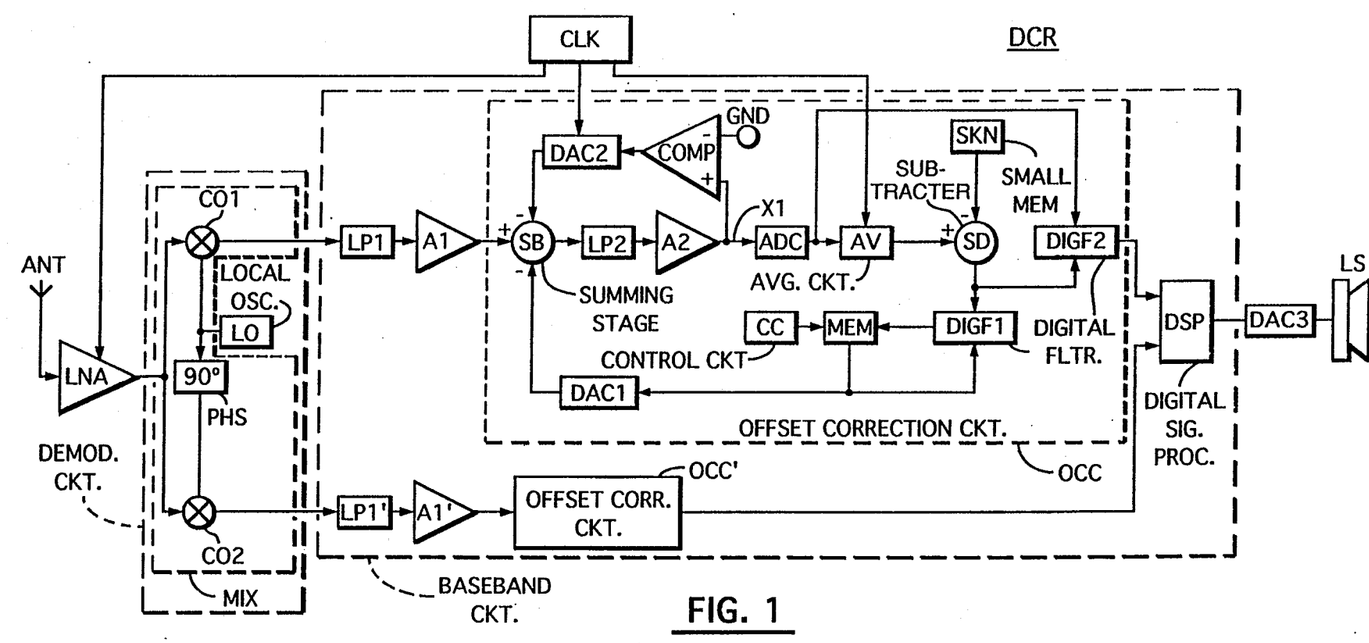
FIG. 1 shows a direct conversion receiver (DCR) according to the invention.
Figure 2:
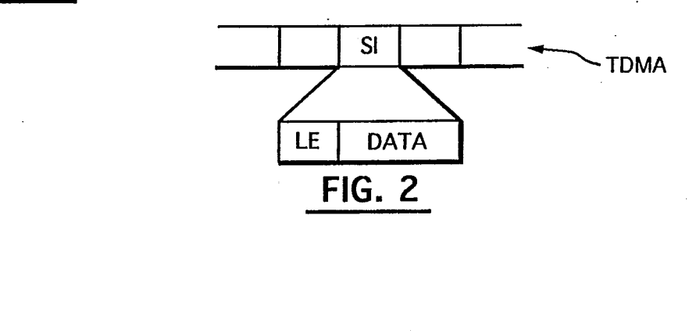
FIG. 2 shows a TDMA structure used in the direct conversion receiver of FIG. 1.

The direct conversion receiver DCR shown in FIG. 1 includes a clock circuit CLK controlling it and providing timing signals according to the TDMA structure of FIG. 2 which consists of time slots SI arranged in (not shown) frames and multiframes. The time slots SI may contain data and/or control information to be received by the direct conversion receiver DCR and/or to be transmitted by a (not shown) transmitter accompanying DCR. The type of data (voice, control, . . . ) and time slot assignment to a station transmitting the data (the transmitter accompanying DCR, a base station or a mobile subscriber transmitting to DCR, . . . ) are predetermined and are communicated to DCR when a first communication between DCR and e.g. a base station or mobile subscriber is started up. The time slots carrying data to be received by the direct conversion receiver DCR, henceforth also referred to as assigned time slots, each include a leading part LE and a data part DATA as also shown in FIG. 2. The purpose of the leading part LE is explained hereinafter. The data part DATA contains data sent by a base station or a mobile subscriber to DCR.

As shown in FIG. 1 the direct conversion receiver DCR includes an antenna ANT for receiving, analog modulating signals which each correspond to a digital signal and are modulated on a carrier with a carrier frequency FC. These signals are so-called Gaussian Minimum Shift Keying (GMSK) modulated signals. Such a GMSK modulation scheme is e.g. described in the book "Mobile Cellular Telecommunications Systems" by W. C. Y. Lee, published by McGraw-Hill Book Company, 1989, pp. 411–416. The antenna ANT is connected to an input of a low noise high frequency amplifier LNA having a gain mode GM, which is set to either of two modes dependent upon the level of the received analog modulating signal modulated carrier. A control input of LNA is connected to a clock circuit CLK, and an output of it is connected to a demodulator circuit MIX,LO which constitutes a so-called GMSK-demodulator. This demodulator circuit includes a mixer MIX which consists of two coupled so-called correlators CO1 and CO2 and a $\pi/2$ phase shifter PHS connected between CO1 and CO2 and which is connected to a local oscillator LO as shown in FIG. 1. Such correlators and such a mixer are e.g. described in the book "Digital Communications—fundamentals and applications" by B. Sklar, published by Prentice-Hall International Editions, 1988, pp. 90–91 and 142–144, respectively. The respective outputs of the correlators CO1 and CO2 are each coupled to a cascaded connection of a lowpass filter, an amplifier and an offset correction circuit, viz. LP1/A1/OCC for CO1 and LP1'/A1'/OCC' for CO2. An output of OCC and an output of OCC' are both connected to inputs of a so-called digital signal processor DSP, an output of which is via a digital-to-analog convertor DAC3 coupled to a loudspeaker LS. DSP as well as LP1/A1/OCC and LP1'/A1'/OCC' are part of a baseband circuit which is DC-coupled to the demodulator circuit MIX,LO.

As the offset correction circuit OCC' is similar to OCC, only OCC is now described in detail hereinafter.

An output of A1 is connected to an input of a comparator circuit SB/LP2/A2, more specifically to a non-inverting first input of a summing stage SB included therein. An output of SB is coupled to an input X1 of an analog to digital convertor ADC via the cascaded connection of a low pass filter LP2 and an amplifier stage A2 both included in the comparator circuit. In its turn X1 is coupled to an inverting second input of SB via the cascaded connection of a comparator COMP and a successive approximative digital to analog convertor DAC2 which is controlled by the clock circuit CLK. A non-inverting input of COMP is connected to X1, whereas an inverting input of COMP is connected to a ground terminal GND providing a zero reference voltage. An output of ADC is connected to an averaging circuit AV which together with ADC forms a signal averaging circuit, and an output of which is coupled to a non-inverting input of a subtracter circuit SD. AV is controlled by a timing signal provided by the clock circuit CLK. A small memory SKN storing a reference average value of each of the received analog signals is connected to an inverting input of SD. As the reference average value of each of the analog signals is assumed to be identical, SKN includes only one storage location storing this value. An output of the summing stage SD is connected to a first input of a digital filter or calculating means DIGF1 an output of which is connected to a first input of a storage means MEM storing different offset correction values for different carrier frequencies FC and different gain modes GM as will be explained hereinafter. MEM is controlled by a control circuit CC.

An output of MEM is connected to a second input of DIGF1 and is coupled to an inverting third input of the summing stage SB via a digital to analog convertor DAC1. The output of SD is furthermore connected to a first input of a second digital filter DIGF2 a second input of which is connected to the output of ADC and an output of which constitutes the output of OCC connected to DSP.

The operation of the direct conversion receiver DCR is described hereinafter.

After start-up, the direct conversion receiver DCR is synchronized to the TDMA structure, i.e. the timing signals provided by the clock circuit CLK to LNA, DAC2 and AV are synchronized to the TDMA structure for which a synchronization signal transmitted by e.g. a base station and received by DCR is used, and the assigned time slots and the sources, i.e. base station or mobile subscribers, they are assigned to, are known in the DCR as a result of received control information. The leading part LE included in such an assigned time slot is provided in order for the direct conversion receiver DCR to be able to adjust to varying power levels of received signals, these levels varying e.g. because the received signals are transmitted by different sources at different distances, by moving sources, or because of fading. This function of the leading part LE not being a subject of the invention it is not further discussed here, During the data part DATA of the assigned time slot the carrier modulated with an analog modulating signal corresponding to a digital signal is received. This analog signal is GMSK modulated on a carrier with a carrier frequency FC. The carrier frequency FC on which an analog signal sent by one and the same source, i.e. base station or mobile subscribers, is modulated, changes from time slot to slot according to a pre-agreed pattern, which is known in the art as frequency-hopping. This technique is described e.g. in the above book by B. Sklar, pp. 555–562. The pre agreed pattern according to which the carrier frequency changes is e.g. communicated to the direct conversion receiver DCR when a communication between one of the base stations or mobile subscribers and DCR is started up, and is then known in the control circuit CC.

The analog modulating signal modulated carrier is received via the antenna ANT and amplified by the low noise amplifier LNA the gain mode GM of which is set to one of two possible modes depending on the level of the received modulated carrier, and is also known in CC. The modulated carrier is then demodulated by the mixer MIX by multiplying it with a local oscillator signal which is provided by LO and which has the same frequency as the carrier wave. Thus, two demodulated analog signal parts are obtained, one corresponding to a so-called in-phase (I) channel of the analog modulating signal which is output by CO1, and another corresponding to a so-called quadrature (Q) channel of the analog modulating signal which is output by CO2. Both the I- and Q-channels are baseband signals, i.e. they are no longer frequency-shifted over a carrier frequency FC. The I- and Q-channels are then filtered in the lowpass filters LP1 and LP1 and amplified by A1 and A1', respectively. Both channels henceforth being processed in the same way by OCC and OCC', respectively, only the processing of one of the two channels, viz. the I-channel, is discussed hereafter.

The I-channel present at the output of A1 corresponds to a digital signal part consisting of bits which after coding and pulse shaping constitute the I-channel.

Assuming an equal probability for a bit to be '0' or '1' the average value of the analog signal depends on the coding technique used and possibly also on the pulse shaping waveform applied. When e.g. so-called AMI-coding is applied one can easily show that the average value of the analog signal is zero. Henceforth it will be assumed that a coding technique giving rise to a zero average value is used.

The I-channel, constituting an input signal for OCC, is applied to the non-inverting input of the summing stage SB wherein a variable parameter offset correction value and a single offset correction value both discussed hereinafter are subtracted from it. The variable parameter offset correction value is provided by the storage means MEM after being converted to an analog value by DAC1. The result of the subtraction is filtered in the lowpass filter LP2 and then amplified by the amplifier stage A2-so providing a difference signal at input X1 of ADC.

In order to be able to discuss the two offset correction values applied to the inverting inputs of SB, different sources introducing offset in DCR are now discussed hereafter.

A first source of offset is due to the signal provided by the local oscillator LO and appearing at the local oscillator input of the mixer MIX, i.e. at the local oscillator inputs of both CO1 and CO2, partly leaking to the input of the mixer MIX to which the received modulated carrier is applied, due to capacitive or inductive crosstalk between the latter two inputs. At the received signal input of MIX this leaked local oscillator signal part is added to the received modulated carrier. As a consequence, a first offset part is generated due to the mixer MIX multiplying the thus changed received signal with the local oscillator signal. Indeed, the result thereof includes the square of the local oscillator signal and ergo, since the local oscillator signal is assumed to be sinusoidal, a DC part constituting the first offset part. To be noted is that due to the coupling between the local oscillator and the high frequency part inevitably being frequency dependent, this first offset part varies with the frequency of the local oscillator signal.

A second source of offset is due to so-called self-mixing, i.e. the received modulated carrier applied to the received signal input of MIX partly leaks to the local oscillator input of the mixer MIX. Thereby, as the result of the multiplication operation performed by the mixer includes a DC part resulting from the square of the received signal, an offset is generated which depends on the frequency of the received signal and on its power level. As for the local oscillator leakage mentioned above, the frequency dependency is due to the coupling between the local oscillator and the high frequency part. In the following equations (1) where both offset sources discussed sofar are combined, dem represents the demodulated analog signal, losi represents the signal provided by the local oscillator which is sinusoidal with amplitude A, rec represents the received modulated carrier which, although occupying a non-zero bandwidth, is assumed substantially sinusoidal and is therefore also represented as a sinusoid with amplitude $\alpha$, a represents the fraction of the local oscillator signal leaking to the received signal input of MIX, and $\beta$ represents the fraction of the received signal leaking to the local oscillator input of MIX.

$$dem = (rec + \alpha \times losi) \times (losi + \beta \times rec) \quad (1)$$
$$= rec \times losi \times (1 + \alpha \times \beta) + \alpha \times losi^2 + \beta \times rec^2$$

where $losi = A \times \sin\omega t$ and $rec = B \times \sin\omega' t$ so that $\alpha \times losi^2 = \frac{\alpha}{2} \times A^2 - \frac{\alpha}{2} \times A^2 \times \cos 2\omega t$ and $\beta \times rec^2 = \frac{\beta}{2} \times B^2 - \frac{\beta}{2} \times B^2 \times \cos 2\omega' t$ From these equations it is seen that an offset equal to $$\frac{\alpha}{2} \times A^2 + \frac{\beta}{2} \times B^2$$

is thus generated.

To be noted is that the terms containing $\cos 2\omega t$ and $\cos 2\omega' t$ can be filtered out easily by the lowpass filter LP1, that the term in $\alpha \times \beta$ is sufficiently small to be neglected, and that the square of rec will always have a non-zero average giving rise to offset even if rec is not sinusoidal.

A third offset source is caused by so-called front-end pick-up, which is due to the local oscillator signal partly leaking via the environment of the receiver, e.g. via a housing surrounding it, to the input of the low noise amplifier LNA and to the antenna ANT where this leaked local oscillator signal part is added to the received signal. As for the first offset source this causes an offset to be generated by the mixer which is also dependent upon the frequency of the local oscillator signal. The main difference however with the first offset source, and also the reason for distinguishing between the first and the third offset source, is that since this offset is due to leakage via the environment it is also influenced by the position of the direct conversion receiver DCR and thus e.g. by a person holding the receiver or a handset thereof and by the position of this handset.

Thus it is clear that the second and the third mentioned offset source provide unpredictable offset parts, the second due to its dependency upon the power level and the frequency of the received signals and the third due to its position dependency, whereas the offset introduced by the first mentioned offset source could theoretically be measured and compensated for at fabrication since it only depends on the frequency—and the power level—of the local oscillator signal which is known. However due to alteration of component characteristics with time such compensation would not remain accurate. The same applies to offset introduced due to component mismatches which, since it is quasi-constant, is also referred to as static offset. To be noted here that even received signals not to be demodulated and thus filtered out in the lowpass filters LP1 and LP1' introduce offset, as these signals too leak to the local oscillator input of MIX.

Summarizing, the combination of the offset sources mentioned above provides an offset which depends upon the power level and the frequency of the local oscillator signal as well as the received signals, and the position of the receiver.

Moreover, since the offset mentioned is due to leakage because of capacitive or inductive coupling in the direct conversion receiver, it is composed of a portion due to leakage to the input of LNA and a portion due to leakage to the output of LNA. Hence, the first portion being influenced by the gain mode GM unlike the second portion, the offset at different values of the gain mode GM is different and dependent upon the ratio of the first portion to the second portion.

Hence, the carrier frequency FC and the gain mode GM constitute variable parameters on which the offset depends. This offset is compensated in the following way.

During the leading part LE of an assigned time slot the clock circuit CLK provides a signal switching off the LNA and thereby inhibiting the received modulated carrier to reach the mixer MIX. Consequently, during LE only offset due to the above mentioned first offset source and static offset is added to the demodulated analog signal which however is zero since no received modulated carrier is applied during LE. Thus the signal applied to the non-inverting input of the summing stage SB only consists of offset. The output of SB, filtered by LP2 and amplified by A2, is applied to the noninverting input of COMP which compares it to the expected value of the signal at X1 during LE when no offset would be generated, i.e. zero provided by GND. When the signal at X1 is positive, COMP provides a positive voltage at its output indicating a binary 1, whereas when the signal at X1 is negative a negative voltage is provided indicating a binary 0. Thus COMP acts as a one bit analog to digital convertor. The thus obtained digital output signal of COMP controls the successive approximative digital to analog convertor DAC2 which, within the leading part LE and in successive steps, generates a single offset correction value to be applied to the inverting second input of SB by successively adjusting a digital number to a value which converted to an analog signal provides the single offset correction value making the signal at X1 closer to zero at each step. In other words, at each of these steps the digital output signal of COMP is first monitored by DAC2 and then a next bit of the digital number is either set to 1 or to 0 dependent upon the signal of COMP representing a binary 1 or 0, respectively, thereby increasing the accuracy of the single offset correction value by one bit. Thus, when the signal at X1 is positive, COMP provides a binary 1 at its output which causes a bit of the digital number generated by DAC2 to be set to 1 thus increasing its analog output signal and providing a larger single offset correction value to be subtracted in SB and thus decreasing the signal at X1.

The accuracy of the offset compensation depends on the accuracy of DAC2.

Within LE and after the single offset correction value has been determined, the DCR adjusts to varying power levels of received signals as mentioned above.

It should be noted that since the implementation of DAC2 is not a subject of thee invention, it is not described here. Furthermore, other possibilities for determining this single offset correction value can be thought of. Knowing the average value of the analog baseband signal is zero one could e.g. measure the average value of the analog baseband signal over a number of time slots, the result of which then provides the single offset correction value. In order to avoid distortion of the measured average value by high signal power levels, one could e.g. only use time slots in the calculation in which signals with a power level below a predetermined limit are received.

Due to the frequency-hopping, the dependency of the offset upon the received modulated carrier's frequency and amplitude, and hence also upon the gain mode of the LNA, and, for the successive approximative solution described above, due to exclusion of the second and the third offset source, the above single offset correction value does not provide an accurate correction for the total offset introduced to the analog baseband signal. Therefore, a second more accurate offset correction value is determined as follows at each of the assigned time slots.

The reason for determining and applying the single offset correction value will become clear after the discussion of the more accurate variable parameter offset correction value hereafter.

The signal at X1 is converted by ADC to a digital value at the rate of the bits of the digital signal corresponding to the demodulated analog signal thereby providing consecutive digital values indicating the power level of each bit of the difference signal at X1. These digital values are then applied to the averaging circuit AV which can easily be implemented as a small digital processor. AV calculates an instant average value of the digital values over the data part DATA of an assigned time slot, the boundaries of this data part being indicated by the signal applied to AV by the clock circuit CLK. The thus calculated instant average value is then applied to the non-inverting input of the subtracter circuit SD where the reference average value, here zero, of the analog-baseband signal is subtracted from it. The result thereof constitutes a resulting control value which is applied to the digital filter DIGF1. Another input signal for DIGF1 is supplied by the storage means MEM and constitutes a variable parameter offset correction value as calculated previously for the values of the variable parameters, i.e. gain mode GM and carrier frequency FC, associated to the present assigned time slot. This variable parameter offset correction value which is the one subtracted from the demodulated analog signal in SB as mentioned above, is read from the storage location of MEM indicated by the signal at the control input of MEM and provided by the control circuit CC which is derived from the current carrier frequency FC and gain mode GM. In the digital filter DIGF1 a new variable parameter offset correction value is calculated from the output signal of SD and the value provided by MEM as seen in equations (2a) and (2b) which constitutes the so-called z-transform of equation (2a) as indicated by Z, and where $\gamma$ is a proportionality factor, meas indicates the output value of SD, memv indicates the value provided by MEM and memvn indicates the newly calculated variable parameter offset correction value.

To be noted that a more intricate function may be thought of to be implemented in DIGF1.

$$memvn = memv + \gamma \times meas \quad (2a)$$

$$Z(memvn) = \frac{Z(memv)}{z} + \gamma \times Z(meas) \quad (2b)$$

The thus newly calculated variable parameter offset correction value is then rewritten in the storage location of MEM from which the previously calculated variable parameter offset correction value was originally read, thereby updating the contents of MEM.

To be noted that the storage means MEM is initialized with estimated values of the variable parameter offset correction values when the direct conversion receiver DCR is started up, and hence, that these estimated values constitute the first of the above mentioned previously calculated variable parameter offset correction values. A bad estimate merely causes the stored values to provide a bad offset correction for a somewhat longer period so that the single offset correction value may be needed somewhat longer.

As the average value of the analog signal so calculated has a Gaussian probability distribution whose mean is equal to the sum of the reference average value and the offset, and whose standard deviation is inversely proportional to the square root of the number of bits, the estimate of the average value can be improved by calculating it over a large number of time slots, thus decreasing the standard deviation by a factor equal to the square root of this number of time slots. Since the average is to be calculated only over time slots with the same carrier frequency FC and the same gain mode GM, the number of time slots needed to obtain an accurate estimate of the average value and there by of the introduced offset is especially large when a large number of different carrier frequencies and gain modes is used.

Hence, some time being taken for an accurate estimate of the variable parameter offset correction value to be made, the offset on the signal at the output of SB may during this time be relatively large so that the amplifier A2 is possibly saturated. In order to avoid this, the earlier described single offset correction value is calculated and applied to keep the offset still present at the output of SB within boundaries.

From the signal at the output of ADC which is obtained by converting the analog difference signal at X1 to a digital value, the resulting control value provided by SD is subtracted in the digital filter DIGF2. Thus, a similar transfer function as for DIGF1—equations (2a) and (2b) where $\gamma$ equals 1—is used for DIGF2, which may, however, also be more intricate. Thereby, the offset correction as provided by the variable parameter offset correction value and by the single offset correction value in SB is further improved as can be seen from equations (3) where I represents the input signal of the offset correction circuit, i.e. the analog demodulated signal provided by the demodulator circuit, O represents the difference signal as present after ADC, A the amplification of the cascaded connection of LP2, A2 and ADC, O represents the output signal of the digital filter DIGF2, and E(x) represents the average value of x over the data part DATA of a time slot.

In these idealized equations the variable parameter offset correction value as well as the resulting control value are both represented by the average value E(O) of the difference signal which can only be exact if ADC and DAC1 would provide a perfect conversion and if the offset would not change in function of time. Also, the single offset correction value not changing over the data part DATA of a time slot, it is not explicitly mentioned in this equation but is already incorporated in I.

$$O = A \times (I - E(O)) \quad (3)$$

$$\text{hence } E(O) = A \times (E(I) - E(O)) = \frac{E(I) \times A}{1 + A}$$

$$O' = O - E(O) = A \times (I - E(I))$$

and $E(O') = 0$

Hence, assuming A is not too small, the average value E(O) of O is substantially equal to the average value E(I) of I, i.e. the offset on O is substantially equal to that on I and is hence relatively decreased by a factor A. However, the average value E(O') of O' is zero as indicated by equation (3) and hence offset correction is again improved.

To be noted that when the variable parameter offset correction value would not be fed back to SB the average value E(O') of O' would also be zero, but the average value of the signal at the input of LP2 constituting the offset on that signal, would then be E(I) instead of $E(I)/(1+A)$ in case of feedback, which, being a factor $1+A$ larger, would most probably saturate A2.

One should also note that the final offset corrected signal O' can e.g. also be obtained by subtracting from O an instant average value calculated over subsequent time slots without taking the variation of the offset with FC or GM into account. This provides a less accurate offset compensation which may nevertheless be sufficient.

While the principles of the invention have been described above in connection with specific apparatus, it is to be clearly understood that this description is made only by way of example and not as a limitation on the scope of the invention. Likewise, although the invention has been shown and described with respect to a best mode embodiment thereof, it should be understood by those skilled in the art that the foregoing and various other changes, omissions and additions in the form and detailed thereof may be made therein without departing from the spirit and scope of the invention.

We claim:

1. Offset correction circuit (OCC) for removing offset from an input signal being input thereto in assigned time slots, characterized in that said offset depends upon a variable parameter (FC, GM) whose value is characterized by one of a plurality of possible variable parameter values, one of which is valid in each of said assigned time slots, and that said offset correction circuit (OCC) includes a servo control loop which includes:
    storage means (MEM) storing a variable parameter offset correction value for each of said plurality of possible variable parameter values;
    a summing stage (SB, LP2, A2) having a signal input to which said input signal is applied, having at least one parameter input to which one of said variable parameter offset correction values is applied from the storage means, and having an output on which a difference signal is provided;
    a signal averaging circuit (ADC, AV) for averaging said difference signal over each of said time slots, thereby providing an instant average value;
    a subtracter circuit (SD) wherein said instant average value is subtracted from a reference average value of said input signal, thereby providing a resulting control value; and
    a calculating means (DIGF1) which regularly combines said resulting control value with said one variable parameter offset correction value, and stores the result in said storage means (MEM).

2. Offset correction circuit (OCC) according to claim 1, characterized in that it is applied in a direct conversion receiver (DCR) including a demodulator circuit (MIX, LO) to an input of said demodulator circuit a carrier modulated by an analog modulating signal in said assigned time slots is applied and which provides at its output a demodulated analog signal constituting said input signal to said offset correction circuit (OCC), that said offset correction circuit (OCC) is included in a baseband circuit (LP1, A1, OCC, LP1', A1', OCC', DSP) which is DC coupled to said demodulator circuit (MIX, LO).

3. Offset correction circuit (OCC) according to claim 2, characterized in that said carrier has a carrier frequency (FC) constituting said variable parameter.

4. Offset correction circuit (OCC) according to claim 2, characterized in that said direct conversion receiver (DCR) includes at least one amplifier stage (LNA) having a gain mode (GM) parameter constituting said variable parameter.

5. Offset correction circuit (OCC) according to claim 2, characterized in that said demodulator circuit (MIX, LO) includes a local oscillator (LO) and a mixer (MIX).

6. Offset correction circuit (OCC) according to claim 1, characterized in that it includes an additional correction circuit (COMP, DAC2) for determining within each of said time slots a single offset correction value which is independent from said variable parameter (FC, GM), and which is applied to another parameter input of said summing stage (SB, LP2, A2) so that said difference signal is proportional to the difference between said input signal and both said one variable parameter offset correction value and said single offset correction value.

7. Offset correction circuit (OCC) according to claim 6, characterized in that said assigned time slots each include a leading part (LE) within which said input signal contains no information to be detected, that said demodulator circuit (MIX, LO) is preceded by a switching means (LNA) for disconnecting said analog modulated signal carrier from said demodulator circuit (MIX, LO) during said leading part (LE), and that within said leading part (LE) said single offset correction value is determined in said additional correction circuit (COMP, DAC2) so that the value of said difference signal is substantially zero.

8. Offset correction circuit (OCC) according to claim 7, characterized in that said additional correction circuit (COMP, DAC2) includes a comparator (COMP) for comparing said difference signal with zero and thereby acting as a one-bit analog-to-digital convertor for providing a comparator output signal to a successive approximative digital to analog convertor (DAC2) for determining in successive steps said single offset correction value so that the value of said difference signal is substantially zero by means of said additional correction circuit (COMP, DAC2) in conjunction with said summing stage (SB, LP2, A2).

9. Offset correction circuit (OCC) according to claim 1, characterized in that upon starting up said offset correction circuit (OCC) said storage means (MEM) is initialized by a control circuit (CC) with estimated values of said variable parameter offset correction values.

10. Offset correction circuit (OCC) according to claim 1, characterized in that it includes a forward correction circuit (DIGF2) in which offset remaining on said difference signal is removed by correcting it with a forward offset correction value.

11. Offset correction circuit (OCC) according to claim 10, characterized in that said forward offset correction value is constituted by said variable parameter offset correction value, and that said forward correction circuit includes a digital filter (DIGF2) to inputs of which said difference signal and said resulting control value are applied and an output of which provides an offset corrected version of said input signal.

* * * * *

UNITED STATES PATENT AND TRADEMARK OFFICE
CERTIFICATE OF CORRECTION

PATENT NO. : 5,422,889
DATED : June 6, 1995
INVENTOR(S) : Sevenhans et al

It is certified that error appears in the above-indentified patent and that said Letters Patent is hereby corrected as shown below:

At column 16, line 30 (claim 11, line 5), please change "circuit includes a digital filter (DIGF2)" to --circuit (DIGF2) includes a digital filter--.

Signed and Sealed this

Twenty-ninth Day of August, 1995

Attest:

BRUCE LEHMAN

*Attesting Officer*  *Commissioner of Patents and Trademarks*